United States Patent [19]

Masuda et al.

[11] Patent Number: 4,804,869
[45] Date of Patent: Feb. 14, 1989

[54] BIMOS LOGICAL CIRCUIT

[75] Inventors: Masami Masuda, Kawasaki; Yasumitsu Nozawa; Takayuki Kawaguchi, both of Yokohama, all of Japan

[73] Assignee: Kabushiki Kaisha Toshiba, Kanagawa, Japan

[21] Appl. No.: 106,429

[22] Filed: Oct. 9, 1987

[30] Foreign Application Priority Data

Mar. 27, 1987 [JP] Japan ................................. 62-73461

[51] Int. Cl.$^4$ .................. H03K 19/01; H03K 19/003; H03K 19/082; H03K 19/094
[52] U.S. Cl. .................................... 307/446; 307/570
[58] Field of Search ............... 307/446, 570, 475, 450, 307/451, 452, 453, 571, 279, 443, 270

[56] References Cited

U.S. PATENT DOCUMENTS

| | | | |
|---|---|---|---|
| 4,713,796 | 12/1987 | Ogiue et al. | 307/446 X |
| 4,719,370 | 1/1988 | Sugimoto | 307/446 |
| 4,719,373 | 1/1988 | Masuda et al. | 307/446 X |
| 4,733,110 | 3/1988 | Hara et al. | 307/446 |

FOREIGN PATENT DOCUMENTS 60-125015  7/1985  Japan .................................. 307/446

OTHER PUBLICATIONS

Katsumi Ogiue et al., IEEE Journal of Solid-State Circuits, "13 ns, 500 mW, 64kbit EclRAM Using Hi-Bicmos Technology", vol. SC-21, No. 5, Oct. 1986.

Primary Examiner—Stanley D. Miller
Assistant Examiner—David R. Bertelson
Attorney, Agent, or Firm—Foley & Lardner, Schwartz, Jeffery, Schwaab, Mack, Blumenthal & Evans

[57] ABSTRACT

The invention is a BiMOS logical circuit having a reduced number of components and increased operating speed. First and second MOS transistors are provided for, respectively, driving first and second bipolar transistors. The gates of these MOS transistors are, respectively, connected to the bases of the second and first bipolar transistors. The input terminal is connected to the gates of the MOS transistors.

4 Claims, 3 Drawing Sheets

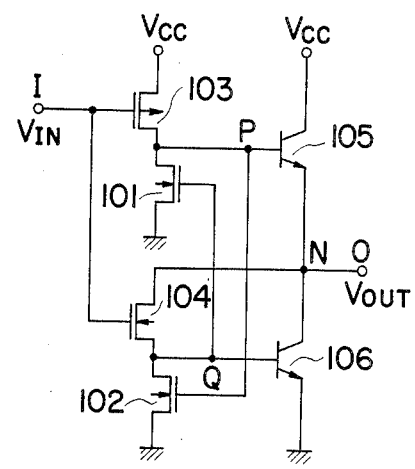
F I G. 4
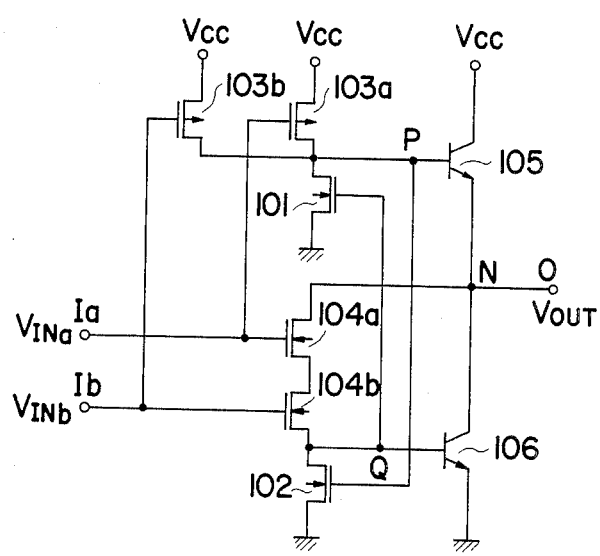
F I G. 5

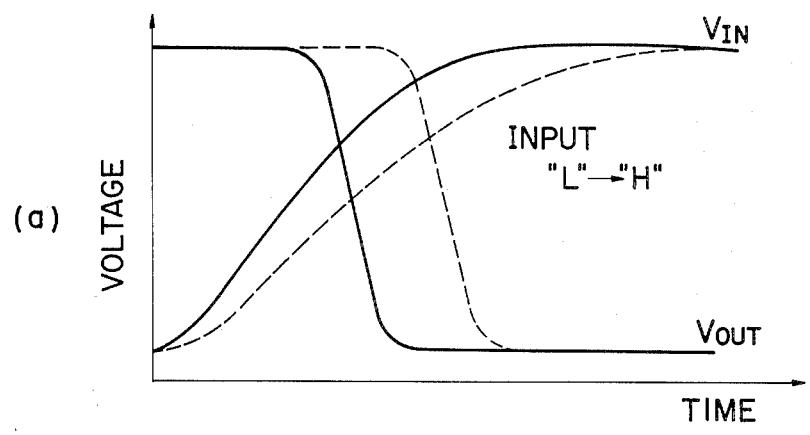
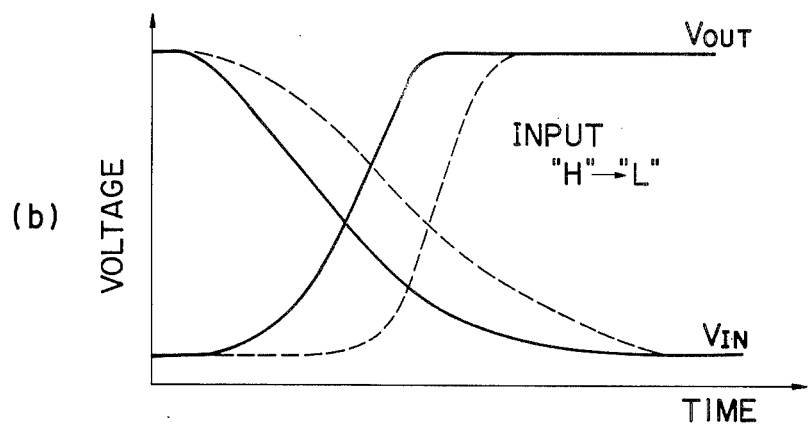
F I G. 6

BIMOS LOGICAL CIRCUIT

BACKGROUND OF THE INVENTION

The present invention relates to a BiMOS logical circuit, and more particularly to a BiMOS logical circuit including bipolar transistors at its output stage.

Recently, logic LSIs are strongly required to have large capacity and low power dissipation. Accordingly, there is a tendency that the position of CMOS transistors to meet such requirements is being increasingly elevated. The performance of the CMOS transistors has been considerably improved in recent years by making free use of fining technologies.

However, the circuits using such CMOS transistors have the serious drawback that the operating speed is slower than that of the circuits using bipolar transistors because of the small current drivability. To improve the current drivability, there may be employed a method to increase the capacity of each component. However, this method is not so effective in that the employment thereof results in an increase in the gate capacity. Such a method eventually leads to the bad effect that it runs counter to integration because the area occupation of components becomes large.

To avoid this, BiMOS logical circuits using bipolar transistors at its output stage are employed. FIG. 1 shows an example of an inverter constituted with such a BiMOS logical circuit. This inverter circuit is composed of four MOS transistors, i.e., three NMOS transistors 1, 2 and 4 and a PMOS transistor 3, and two bipolar transistors 5 and 6. An inverted signal of an input voltage $V_{IN}$ delivered to the input terminal 1 is output from the output terminal 0 as an output voltage $V_{OUT}$. The base currents Of the bipolar transistors 5 and 6 are controlled by the MOS transistors and the bipolar transistors are used at the output stage. For this reason, the current drivability is improved and thus a fast operating speed at which the output waveform becomes sharp can be obtained.

FIG. 2 shows a conventional NAND circuit constituted by dividing the input of the circuit shown in FIG. 1 into two inputs. An output voltage $V_{OUT}$ is determined on the basis of two input voltages $V_{INa}$ and $V_{INb}$ delivered to two input terminals Ia and Ib. Since the number of input terminals is increased, the transistor 1 is composed of two transistors 1a and 1b and the transistor 4 is composed of two transistors 4a and 4b.

FIG. 3 shows another example of the conventional NAND circuit based on the BiMOS logical circuit. This NAND circuit is characterized in that the function of the transistors 4a and 4b is replaced by a diode 7.

One problem with the above-mentioned conventional BiMOS logical circuit is that the operating speed is slow. As previously described, by making use of the bipolar transistors at its output stage the operating speed of the BiMOS logical circuit is considerably improved as compared to that of the CMOS logical circuit. However, since a plurality of MOS gates are connected to the input terminal or terminals, the input capacity becomes large and the waveform of an input signal becomes blunted, so that the operation becomes slow. For example, three MOS gates are connected to the input terminal 1 in the inverter shown in FIG. 1. Similarly, six MOS gates are connected to the input terminals in the NAND circuit shown in FIG. 2.

Another problem therewith is that the number of circuit components considerably increases according as the number of input terminals increases. For example, it is sufficient to use four MOS transistors in the one-input type inverter shown in FIG. 1. On the contrary, seven MOS transistors are required in the two-input type NAND circuit shown in FIG. 2. Such an increase in the number of components is not preferable in that it runs counter to integration. By using the diode as in the circuit shown in FIG. 3, it is possible to reduce the number of components. However, the "L" level of the output voltage $V_{OUT}$ becomes higher than the ideal value by the forward voltage drop $V_D$ of the diode, giving rise to new problem that the response speed becomes slow.

SUMMARY OF THE INVENTION

It is therefore an object of the present invention to provide a BiMOS logical circuit capable of reducing the number of components and of further improving the operating speed.

According to the present invention, there is provided a BiMOS logical circuit comprising: a first MOS transistor, one end of the first MOS transistor being connected to a first power source; a second MOS transistor, one end of the second MOS transistor being connected to the first power source; a first bipolar transistor, the base of the first bipolar transistor being connected to the other end of the first MOS transistor; and a second bipolar transistor, the base of the second bipolar transistor being connected to the second MOS transistor; the first and second bipolar transistors being connected in series at the intermediate node thereof between a second power source and a first power source, the gate of the first MOS transistor and the base of the second bipolar transistor being connected, the gate of the second MOS transistor and the base of the first bipolar transistor being connected; and the BiMOS logical circuit further comprising switching means for selectively establishing either the connection between the other end of the first MOS transistor and the second power source or the connection between the other end of the second MOS transistor and the intermediate node on the basis of an input signal delivered to an input terminal.

In accordance with the BiMOS logical circuit of the invention, first and second MOS transistors are provided for respectively driving first and second bipolar transistors, and the gates of the first and second MOS transistors are respectively connected to the bases of the second and first bipolar transistors. Thus, it is sufficient to connect the input terminal only to the gate of the MOS transistors constituting the switching means. Accordingly, the number of components is further reduced, and the input capacity is also reduced, resulting in attainment of improvement of the operating speed.

BRIEF DESCRIPTION OF THE DRAWINGS

In the accompanying drawings:

FIG. 4 is a circuit diagram showing an example of an inverter circuit in which a BiMOS logical circuit according to the present invention is used;

FIG. 5 is a circuit diagram showing an example of an NAND circuit in which the BiMOS logical circuit according to the present invention is used; and FIGS. 6A and 6B are a graph showing the operational characteristic of the circuit according to the present invention.

DESCRIPTION OF THE PREFERRED EMBODIMENTS

Figure 1:
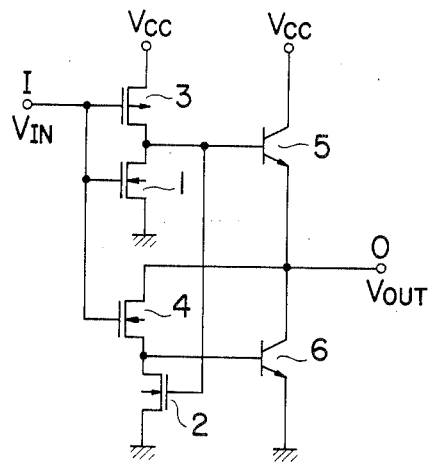
FIG. 1 is a circuit diagram showing one example of conventional inverter circuits.

The present invention will be described in detail in connection with embodiments shown. FIG. 4 is a circuit diagram showing an embodiment of a BiMOS logical circuit according to the present invention. The inverter is constituted in this embodiment. The function of this inverter is equivalent to that of the circuit shown in FIG. 1. This circuit includes a first MOS transistor 101 comprised of an NMOS transistor one end of which is grounded, a second MOS transistor 102 comprised of an NMOS one end of which is grounded, a first bipolar transistor 105 of NPN type of which base is connected to the other end of the MOS transistor 101, and a second bipolar transistor 106 of which base is connected to the other end of the MOS transistor 102. The bipolar transistors 105 and 106 are connected in series at the intermediate node N between the ground and a power source $V_{cc}$. The gate of the MOS transistor 101 and the base of the bipolar transistor 106 are connected at the node Q. In addition, the gate of the MOS transistor 102 and the base of the bipolar transistor 105 are connected at the node P.

This circuit further includes third and fourth MOS transistors 103 and 104. The one end of the MOS transistor 103 is connected to the power source $V_{cc}$, the other end thereof to the base of the bipolar transistor 105, and the gate thereof to the input terminal 1. The one end of the MOS transistor 104 is connected to the intermediate node N, the other end thereof to the base of the bipolar transistor 106, and the gate thereof to the input terminal 1. These MOS transistors 103 and 104 constitute switching means which selectively establishes either the connection between the other end of the MOS transistor 101 and the power source $V_{cc}$ or the connection between the other end of the MOS transistor 102 and the intermediate node N. This circuit outputs an output voltage $V_{OUT}$ corresponding to an input voltage $V_{IN}$ from the Output terminal 0 connected to the intermediate node N.

The operation of this circuit as the inverter is as follows. Assuming now that the input voltage $V_{IN}$ represents "L", the MOS transistor 103 is turned on and a current flows in the base of the bipolar transistor 105 from the power source $V_{cc}$, so that this transistor 105 is turned on. Accordingly, the node P and the intermediate node N become "H", so that the output voltage $V_{out}$ also becomes "H". At this time, since a signal of "H" is delivered to the gate of the MOS transistor 102, this transistor 102 is turned on. Thus, the base of the bipolar transistor 106 is grounded, so that the transistor 106 is cut off. At the same time, the MOS 104 is cut off, with the result that the intermediate node N is isolated from the ground level. In addition, since the node Q represents "L", the MOS transistor 101 is cut off.

Further, assuming now that the input voltage $V_{IN}$ shifts from "L" to "H", the MOS transistor 103 is cut off. Contrary to this, the MOS transistor 104 is turned on. As a result, the node Q is charged from the output side, so that its level rises to the base-emitter forward voltage $V_{BE}$ of the bipolar transistor 106. Thus, the MOS transistor 101 is turned on, so that the node P is discharged to the ground level. As a result, the bipolar transistor 105 is cut off and the MOS transistor is also cut off. Accordingly, the output voltage $V_{OUT}$ is subjected to discharging effect by the transistor 106, so that the output level shifts to "L". It is to be noted that a transistor which is turned on when the gate voltage reaches $V_{BE}$ is used for the MOS transistor 101 because the node Q is maintained at $V_{BE}$ at the time of the above-mentioned operation.

Figure 2:
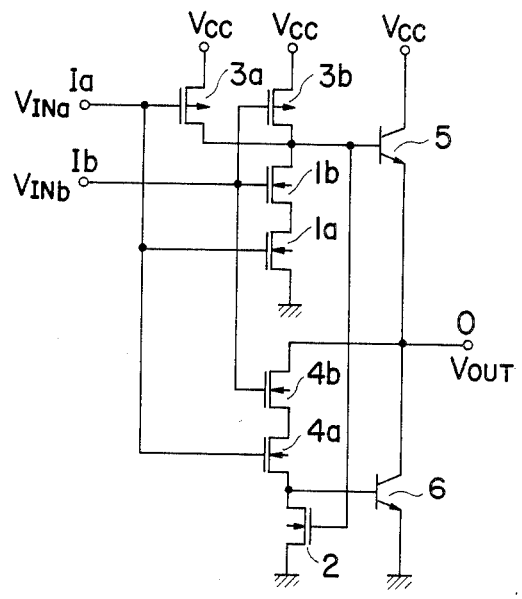
FIGS. 2 and 3 are circuit diagrams showing examples of conventional NAND circuits.

FIG. 5 is a circuit diagram showing another embodiment of a BiMOS logical circuit according to the present invention wherein a NAND circuit is formed. The logical operation of this circuit is equivalent to that of the conventional circuit shown in FIG. 2 or FIG. 3. In this circuit, two input terminals Ia and Ib are provided in place of the input terminal I in the circuit shown in FIG. 4. According to this change, the MOS transistor 103 is replaced by transistors 103a and 103b connected in parallel with each other and the MOS transistor 104 is replaced by transistors 104a and 104b connected in series with each other.

When the input voltages $V_{INa}$ and $V_{INb}$ both represent "L", the MOS transistors 103a and 103b are both turned on and the MOS transistors 104a and 104b are both cut off. Accordingly, the bipolar transistor 105 is turned on, so that the output voltage $V_{OUT}$ becomes "H". At this time, the MOS transistor 102 is also turned on. Thus, the node Q is discharged to the ground level, so that the bipolar transistor 106 is cut off. In addition, the MOS transistor 101 is in off condition. Even when either of the input voltages $V_{INa}$ and $V_{INb}$ shifts to "H", the output still remains at "H".

When both the input voltages $V_{INa}$ and $V_{INb}$ shift to "H", the MOS transistors 103a and 103b are both cut off and the MOS transistors 104a and 104b are both turned on. Thus, the node Q is charged from the output side, so that the bipolar transistor 106 is turned on. Eventually, the output level shifts to "L".

FIGS. 6(a) and 6(b) are graphs showing the response characteristic of the circuit according to the present invention wherein FIG. 6(a) is a graph showing a change of the output voltage $V_{OUT}$ when the input voltage $V_{IN}$ shifts from "L" to "H" and FIG. 6(b) is a graph showing a change of the output voltage $V_{OUT}$ when the input voltage $V_{IN}$ shifts from "H" to "L". In either graph, broken lines represent the characteristic of the conventional circuit shown in FIG. 1 and solid lines represent the characteristic of the circuit according to the present invention shown in FIG. 4. It is seen from these graphs that the bluntness of the input waveform is reduced and thus the operating speed is improved in the circuit according to the present invention. This is because the input capacity is reduced. For example, the input terminal is connected to three MOS gates in the conventional circuit shown in FIG. 1 whereas the number of MOS gates connected to the input terminal is reduced to two in the circuit shown in FIG. 4. Similarly, the input terminal I is connected to six MOS gates in the conventional circuit shown in FIG. 2 whereas the number of MOS gates connected to the input terminal is reduced to four in the circuit shown in FIG. 5.

Figure 3:
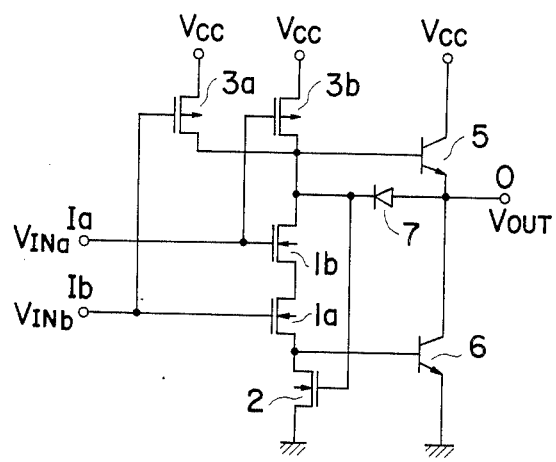

Further, the number of all components is also reduced in connection with the circuit provided with a plurality of inputs. For example, the number of components is nine in the circuit shown in FIG. 2 whereas the number thereof is reduced to eight in the circuit shown in FIG. 5. In addition, since diode as used in the circuit shown in FIG. 3 is not employed, there is no bad influence based on the forward voltage drop $V_D$ of the diode.

The present invention has been explained in connection with the example of one input and the example of two inputs. It is needless to say that the present invention is applicable to circuits provided with a large number of inputs more than two.

As just described above, in accordance with the BiMOS logical circuit according to the present invention, the first and second MOS transistors are provided for respectively driving the first and second bipolar transistors, and the gates of the first and second MOS transistors are respectively connected to the bases of the second and first bipolar transistors. Accordingly, it is sufficient to connect the input terminal only to the gates of MOS transistors constituting the switching means, so that the number of components and the input capacity are reduced, thus making it possible to improve the operating speed.

What is claimed is:

1. A BiMOS logical circuit comprising:
    a first power source;
    a first MOS transistor, one end of said first MOS transistor being connected to said first power source; of said
    a second MOS transistor, one end second MOS transistor being connected to said first power source;
    a first bipolar transistor, the base of said first bipolar transistor being connected to the other end said first MOS transistor; and
    a second bipolar transistor, the base of said second bipolar transistor being connected to the other end of said second MOS transistor;
    a second power source;
    said first and second bipolar transistors being connected in series at an intermediate node thereof between said second power source and said first power source;
    the gate of said first MOS transistor and said base of said second bipolar transistor being connected;
    the gate of said second MOS transistor and said base of said first bipolar transistor being connected;
    said BiMOS logical circuit further comprising switching means for selectively establishing either a connection between the other end of said first MOS transistor and said second power source or the connection between the other end of said second MOS transistor and said intermediate node on the basis of an input signal delivered to an input terminal, thereby to output an output signal corresponding to said input signal from an output terminal connected to said intermediate node.

2. A BiMOS logical circuit as set forth in claim 1, wherein said first and second MOS transistors are both NMOS transistors, and said first and second bipolar transistors are both NPN transistors.

3. A BiMOS logical circuit as set forth in claim 1, wherein said switching means comprises at least one third MOS transistor, one end of said third MOS transistor being connected to said second power source, the other end thereof being connected to said base of said first bipolar transistor, the gate thereof being connected to said input terminal, and at least one fourth MOS transistor, one end of said fourth MOS transistor being connected to said intermediate node, the other end thereof being connected to said base of said second bipolar transistor, the gate thereof being connected to said input terminal.

4. A BiMOS logical circuit as set forth in claim 3, wherein a plurality of input terminals are provided, said switching means further including a plurality of MOS transistors connected in parallel with said third transistor, each with respective input terminals, and a plurality of MOS transistors connected in series with said fourth transistor, each with respective input terminals.

* * * * *